United States Patent
Agarwal et al.

(10) Patent No.: US 8,759,810 B2
(45) Date of Patent: Jun. 24, 2014

(54) PHASE CHANGE MEMORY DEVICES WITH RELAXED STRESS

(75) Inventors: Ritesh Agarwal, Philadelphia, PA (US); Mukut Mitra, Wilmington, DE (US); Yeonwoong Jung, Philadelphia, PA (US)

(73) Assignee: The Trustees Of The University Of Pennsylvania, Philadelphia, PA (US)

( * ) Notice: Subject to any disclaimer, the term of this patent is extended or adjusted under 35 U.S.C. 154(b) by 0 days.

(21) Appl. No.: 13/497,683

(22) PCT Filed: Sep. 24, 2010

(86) PCT No.: PCT/US2010/050134
§ 371 (c)(1),
(2), (4) Date: Mar. 22, 2012

(87) PCT Pub. No.: WO2011/075197
PCT Pub. Date: Jun. 23, 2011

(65) Prior Publication Data
US 2012/0273746 A1 Nov. 1, 2012

Related U.S. Application Data

(60) Provisional application No. 61/245,800, filed on Sep. 25, 2009.

(51) Int. Cl.
*H01L 47/00* (2006.01)
(52) U.S. Cl.
USPC .......... 257/4; 257/3; 257/5; 257/43; 257/538; 438/257; 438/593; 977/762; 977/843; 977/943

(58) Field of Classification Search
CPC . H01L 29/0669; H01L 29/0673; H01L 45/06; G11C 13/025
USPC ............ 257/3–5, 43, 538; 438/104, 482, 585, 438/903; 997/742, 762, 843, 943
See application file for complete search history.

(56) References Cited

U.S. PATENT DOCUMENTS

| 7,405,420 | B1 * | 7/2008 | Wong et al. | 257/4 |
| 7,629,629 | B2 * | 12/2009 | Saitoh et al. | 257/213 |
| 7,795,125 | B2 * | 9/2010 | Buretea et al. | 438/602 |
| 2004/0251551 | A1 * | 12/2004 | Hideki | 257/758 |
| 2006/0034116 | A1 | 2/2006 | Lam et al. | |
| 2006/0160304 | A1 * | 7/2006 | Hsu et al. | 438/257 |
| 2007/0012956 | A1 * | 1/2007 | Gutsche et al. | 257/246 |
| 2007/0257246 | A1 * | 11/2007 | Bakkers et al. | 257/2 |
| 2009/0072218 | A1 | 3/2009 | Savransky | |
| 2010/0048020 | A1 * | 2/2010 | Schrott et al. | 438/692 |

OTHER PUBLICATIONS

Mitra, Makut, et al, "Extremely low drift of resistance and threshold voltage in amorphous phase change nanowire devices", American Institute of Physics, 2010.
Braga, Stafania, et al, "Dependence of resistance drift on the amorphous cap size in phase change memory arrays", Applied Physics Letters 94, 092112 (2009).

(Continued)

*Primary Examiner* — Dung A. Le
(74) *Attorney, Agent, or Firm* — Baker & Hostetler LLP (57) ABSTRACT

A phase change memory device that utilizes a nanowire structure. Usage of the nanowire structure permits the phase change memory device to release its stress upon amorphization via the minimization of reset resistance and threshold resistance.

18 Claims, 10 Drawing Sheets

(56) References Cited

OTHER PUBLICATIONS

Elminil, Daniele, et al, "Recovery and Drift Dynamics of Resistance and Threshold Voltages in Phase-Change Memories", IEEE Transactions on ElectronDevices, vol. 54, No. 2, Feb. 2007.

Pirovano, Agostino, et al "Low-Field Amorphous State Resistance and Threshold Voltage Drift in Chalcogenide Materials", IEEE Transactions on ElectronDevices, vol. 51, No. 5, May 2004.

Lee, Se-Ho, et al, "Highly scalable non-volatile and ultra-lowpower phase-change nanowire memory", Nature Nanotechnology, vol. 2, pp. 626-630, Oct. 2007.

Kang, DH, et al, "Two-bit Cell Operation in Diode-Switch Phase Change Memory Cells with 90nm Technology", 2008 Symposium on VLSI Technology Digest of Technical Papers, pp. 98-99.

Karpov, I.V., et al, "Fundamental drift of parameters in chalcogenide phase change memory", Journal of Applied Physics 102, 124503 (2007).

Bin, Yu, et al, Chalcogenide Nanowire Based Phase Change Memory, IEEE Transactions on Nanotechnology, vol. 7, No. 4, Jul. 2008.

* cited by examiner

PHASE CHANGE MEMORY DEVICES WITH RELAXED STRESS

This Application is the national phase filing of International Application No. PCT/US10/50134 filed Sep. 24, 2010, which claims the benefit of U.S. Provisional Application Ser. No. 61/245,800, filed on Sep. 25, 2009, the contents of which are incorporated herein by reference.

This invention was made with government support under ONR N000140910116 awarded by the Office of Naval Research and NSF-DMR (0706381) awarded by the National Science Foundation. The government has certain rights in the invention.

BACKGROUND OF THE INVENTION

1. Field of the Invention

The field of the invention is directed towards Phase Change Memory (PCM) devices. In particular, the field of the invention is directed to the relaxation of stress in PCM devices.

2. Description of the Related Technology

The most recent memory technology to gain widespread acceptance is flash memory. However, as storage and speed requirements increase with each new product generation, flash memory is reaching the end of its ability to keep pace with new demands. The technology can scale up only so far as the processes used to make these chips reach both practical and theoretical limits. Recently, Phase transition random access memory (PRAM) and PCM has attracted great attention due to its nonvolatile memory properties and fast write/read speeds. Furthermore, it has the potential to solve many intrinsic limitations of conventional memory devices such as dynamic random access memory, static random access memory, and flash. The realization of PRAM devices is, however, still limited due to the requirements of small cell size, high scalability, and low power consumption.

The major bottleneck for achieving high density PRAM devices is the large writing currents needed to prepare the system in the amorphous physical state associated with a high resistance reset state and the drift in resistance and threshold voltage leading to data loss and device variability. The reduction of writing currents by reducing the device size is desirable because it can realize faster amorphization of material with less power consumed, enabling fast memory switching speed with high reliability. These challenges motivate the design of device schemes with sublithographic features based on a bottom-up approach using nanowires (NWs) with small diameters.

A PCM cell made of chalcogenide alloy, such as for example a Ge—Sb—Te alloy, utilizes an electrically initiated reversible amorphous-to-crystalline phase change with significant different electrical resistivities. The different phase resistances are used as the two logic states. PCM is also promising for realizing a multi-level cell (MLC) operation because it has a very wide range of resistance across two orders of magnitude. According to the PRAM road map, it is expected that the highest memory densities of PRAM will be comparable to memory densities of conventional memories such as NOR Flash and DRAM in the coming years when MLC operation is fully accomplished. However, in order to realize MLC operation in PCM devices, the temporal drift of the resistance is a major roadblock since it can erase the information that has been written on the device.

Figure 1:
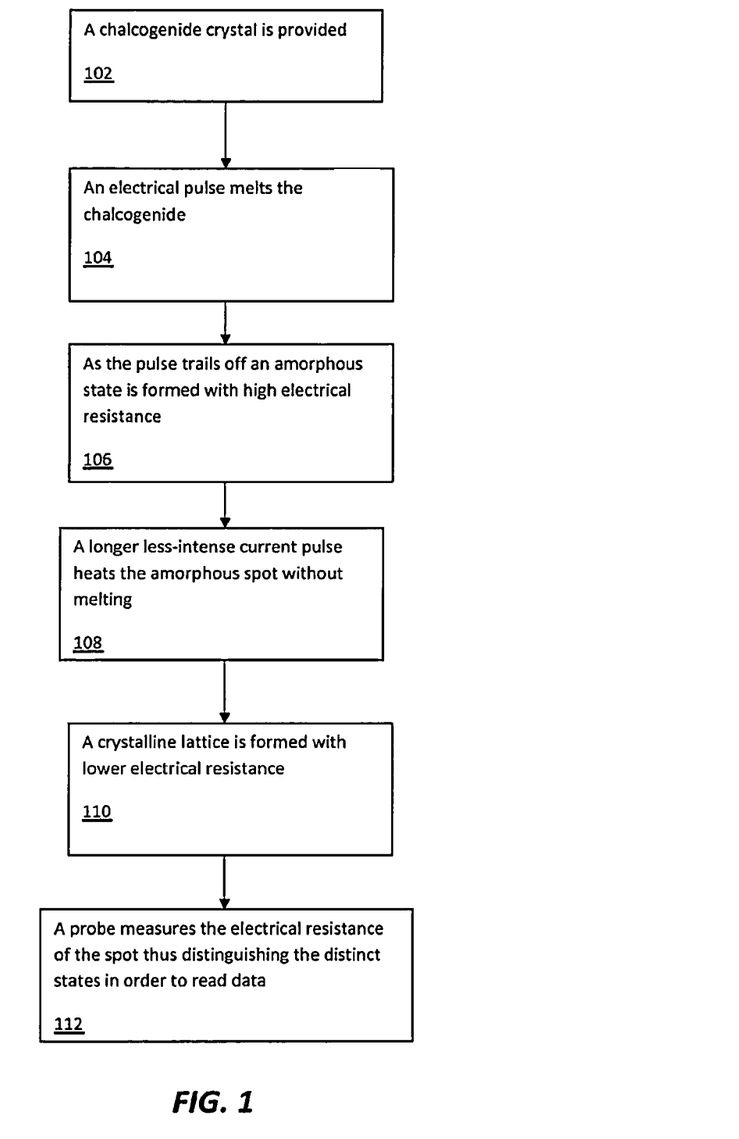
FIG. 1 is a flow chart showing the process by which digital data is stored in a PCM device.

In operation, PRAM and PCM devices use electrical current to trigger the structural change. FIG. 1 is a flow chart showing the process by which a PCM device stores data. In step 102 a chalcogenide crystal is provided. A chalcogenide is a chemical compound consisting of at least one chalcogen ion and at least one more electropositive element. All group XVI elements of the periodic table are defined as chalcogens; however the term is more commonly used for indicating sulfides, selenides and tellurides, rather than oxides.

In step 104, an electrical pulse lasting a few tens of nanoseconds in duration melts the chalcogenide at a particular spot. In step 106, when the pulse rapidly tails off, the melted spot's temperature drops quickly and the disorganized atoms freeze in place to form an amorphous phase with high electrical resistance. In step 108, for re-crystallization, the process requires a longer, less-intense current pulse that heats the amorphous spot without melting it. In step 110, energy from the second heating process of step 108 energizes the atoms just enough so that they rearrange themselves into a crystalline lattice, which is characterized by a lower electrical resistance. In step 112, a probe measures the electrical resistance of the spot thus permitting one to distinguish the distinct states of higher and lower electrical resistance as 0 and 1 in binary logic and reads the recorded information.

In September 2006, Samsung announced a prototype 512 Mb (64 MB) device using diode switches. The prototype featured a cell size of only 46.7 nm, smaller than commercial Flash devices available at the time. The high density of Samsung's prototype PRAM device suggested it could be a viable Flash competitor, and would not be limited to niche roles as other devices have been. PRAM appeared to be particularly attractive as a potential replacement for NOR Flash, where the device capacities typically lag behind capacities of NAND Flash devices. Samsung, in their current prototype 512 MB device also reported that their drift coefficients of amorphous resistance in conventional thin-film devices are of the order of 0.04 to 0.108 at room-temperature for a time interval of $10^3$ seconds after a reset pulse.

Intel and STMicroelectronics, demonstrated their own PCM devices at the 2006 Intel Developer Forum and showed a 128 MB device that recently began manufacture at STMicroelectronics's research lab in Agrate, Italy. Intel stated that the devices were strictly proof-of-concept, but they expect to start sampling within months, and to have widespread commercial production within a few years. Intel reported the drift coefficients of amorphous resistance in conventional thin-film devices are on the order of 0.04 to 0.10 at room-temperature for 9 orders of time interval, spanning from time intervals of $10^{-6}$ to $10^3$ seconds after the reset pulse.

PCM also may be a promising technology in the military and aerospace industries. PCM memory devices have been introduced by BAE Systems, referred to as C-RAM, claiming excellent radiation tolerance (rad-hard) and latchup immunity. Additionally, BAE claims a write cycle endurance of $10^8$, which will allow it to be a contender for replacing PROMs and EEPROMs in space systems.

In February 2008, Intel engineers, in cooperation with STMicroelectronics, revealed the MLC PCM array prototype. The prototype stored two logical bits in each physical cell, effectively 256 MB of memory stored in a 128 MB physical array. This means that instead of the normal two states, fully amorphous and fully crystalline, an additional two distinct intermediate states representing different degrees of partial crystallization, were also employed, thereby allowing for twice as many bits to be stored in the same physical area on the chip. Also in February 2008, Intel and STMicroelectronics began shipping prototype samples of their first PCM product to customers. The 90 nm and 128 MB (16 MB) product are called Alverstone™.

While PCM devices are being developed to reduce data drift and increase storage, there is still need in the field to develop a PCM device that provides efficient relaxation of stress. This may be accomplished via the development of a PCM device that is able to release its stress upon amorphization via the minimization of reset resistance and threshold resistance.

SUMMARY OF THE INVENTION

An object of the present invention may be the provision of a PCM device.

Another object of the present invention may be the provision of a nanowire PCM device.

Still yet another object of the present invention may be the provision of a free standing nanowire PCM device.

Another object of the present invention may be the provision of a PCM device with a reduced resistance drift coefficient.

Still yet another object of the present invention may be the provision of a PCM device with an increased surface area.

An aspect of the invention may be a phase change memory device including, but not limited to, a nanowire; a first electrode located at a first end of the nanowire; a second electrode located at a second end of the nanowire; and wherein the nanowire is free standing.

Another aspect of the invention may be a phase change memory device including, but not limited to, a chalcogenide compound; a first electrode operably connected to the chalcogenide compound; a second electrode operably connected to the chalcogenide compound, and wherein a current is applied to the chalcogenide compound to form an amorphized region; wherein the resistance drift coefficient is less than 0.01.

Still yet another aspect of the invention may be a method of reading digital memory comprising the steps of: providing a nanowire with a first electrode and a second electrode connected thereto; applying a first current through the first electrode and forming an amorphized region; measuring a first resistance of the nanowire; applying a second current through the first electrode wherein the second current forms a crystal lattice within the nanowire; measuring a second resistance of the nanowire; and wherein the nanowire resistance drift coefficient is less than 0.01.

These and various other advantages and features of novelty that characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

DETAILED DESCRIPTION OF THE PREFERRED EMBODIMENT(S)

Figure 2:
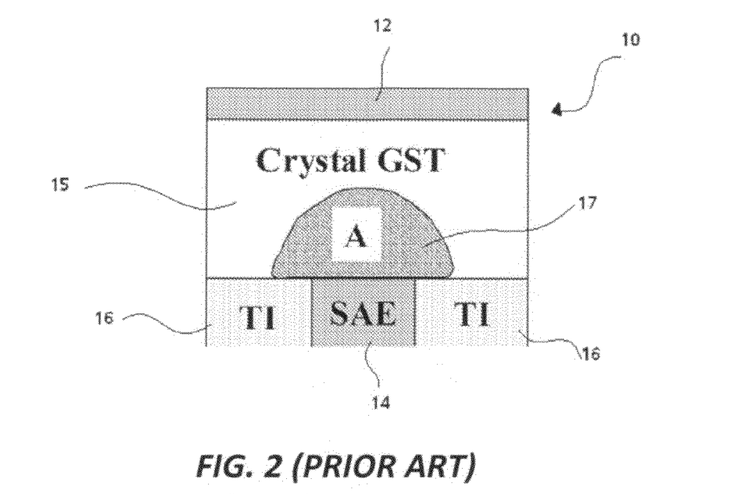
FIG. 2 is a diagram depicting a conventional thin-film phase change memory device placed within a sandwich structure.
Figure 6:
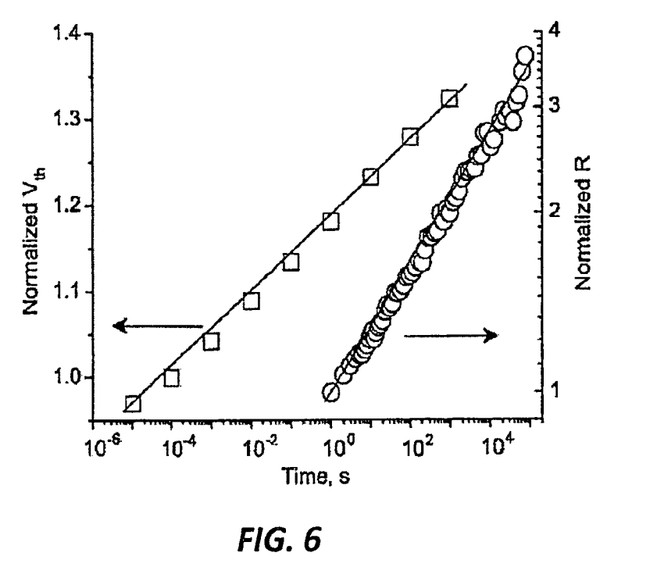
FIG. 6 is a graph showing the temporal drift of $V_{th}(t)$ and $R(t)$ for a GST thin film device.

A major challenge for phase change memory has been the drift of amorphous state resistance and threshold voltage with time. Referring to FIG. 2, a conventional thin-film phase change memory device 10 with a sandwich structure is shown. It is known from conventional thin-film devices having sandwich geometry that the resistance of the amorphous state increases according to a power law $R(t)=R(t_0)(t/t_0)^\alpha$, $\alpha$ is ~0.08-0.1 as shown in FIG. 6. The threshold voltage for thin-film devices also shows a high drift coefficient (0.03-0.08). Drift is typically measured by making the compound amorphous and measuring the change in resistance over time. In FIG. 2, a small area electrode (SAE) forms the bottom electrode 14 located under the amorphized dome-like structure 17. Thermal insulators (TI) 16 are located to the left and right of the bottom electrode 14. The chalcogenide compound used in FIG. 2 is $Ge_2Sb_2Te_5$.

The amorphized dome-like structure 17 that forms within the chalcogenide compound 15 is completely embedded between the top electrode 12 and the bottom electrode 14 thereby causing a large build up of stress. This dome-like structure 17 in thin-film devices 10 is embedded between the electrodes 12, 14 and the non-active crystalline GST compound 15 and is therefore prone to higher compressive stress/hydrostatic pressure. This stress/pressure is due to the large volume expansion (6-8% typically) in the materials as a result of the phase change process, which is described above with respect to FIG. 1. Upon relaxation, the compound 15 shows very high resistance and threshold voltage drift coefficients. This severely limits the ability for multilevel cell operation, because a lower intermediate state may be confused with a higher intermediate state at a later time. Furthermore, this could also jeopardize standard two-state operation.

Figure 3:
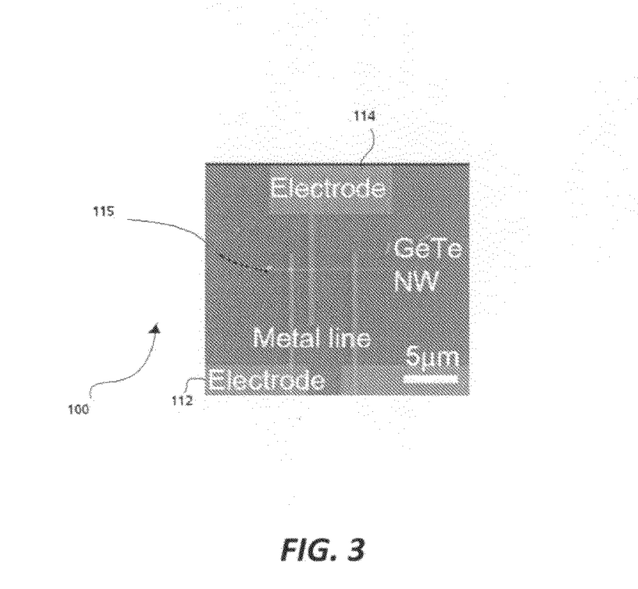
FIG. 3 depicts a free standing nanowire device with two electrodes in accordance with an embodiment of the present invention.
Figure 4:
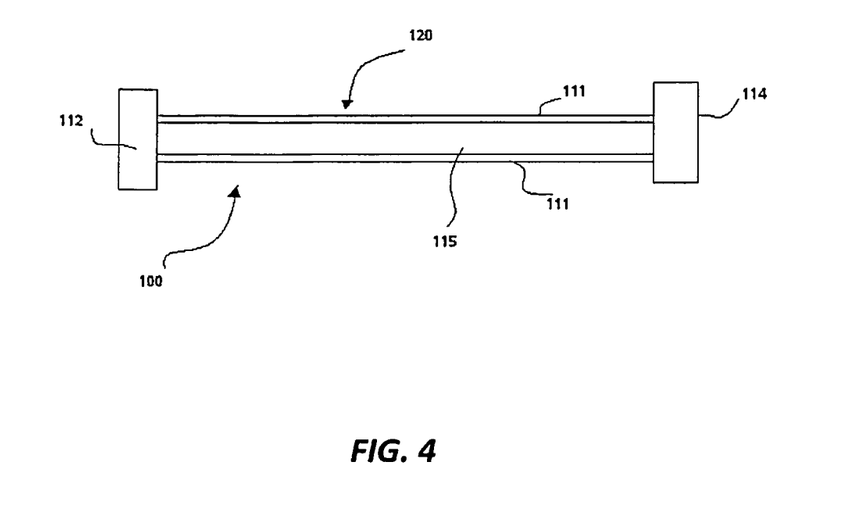
FIG. 4 is a cross-sectional view of the device shown in FIG. 3.

FIGS. 3 and 4 depict a free standing nanowire PCM device 100 that includes a nanowire 115 having two electrodes 112, 114 attached thereto. By "free standing" it is meant that the structure is such that at least a substantial portion of the stress which typically arises in constrained nanowires 115 due to amorphization can be released or avoided. For example, in a free standing device, the surface 120 of the nanowire 115, or other chalcogenide compound, is, preferably, at most, covered by a thin layer of dielectric material 111, which may be silicon dioxide. The thickness of the thin layer of dielectric material 111 is preferably substantially less than the thickness of the nanowire 115 and at least less than half the thickness of the nanowire 115 and more preferably less than a third of the thickness of the nanowire 115. For example in a device that is roughly 90 nm thick, the thickness of the dielectric layer, which may be silicon oxide, may be less than 5 nm, more preferably, less than 3 nm. In general, for the thicknesses of the nanowires disclosed herein any dielectric layer under 20 nm may render the nanowire PCM device 100 "free-standing." Preferably the thickness of the dielectric layer is less than 20 nm, and more preferably the thickness of the dielectric layer is less than 10 nm. The remaining environment around the nanowire 115 should be such as to allow the nanowire 115 to expand, as necessary, during amorphization, without substantial development of stress within nanowire 115. Therefore, the free standing nature of the device effectively provides the nanowire 115 with the ability to flex with ease and reduces or eliminates the stress that may accumulate in the amorphous region of prior art devices so that drift may be substantially reduced.

The different geometries of the thin film PCM device 10 and nanowire PCM device 100, depicted in FIGS. 2 and 4 respectively, is evident in that the nanowire PCM device 100 depicted in FIG. 4 exposes a large surface area 120 of the nanowire 115 provided with the dielectric layer in order to provide efficient stress relaxation.

The present invention employs a free standing nanowire 115, which in the embodiment shown is a compound which is comprised of GeTe. Phase change nanowire 115, as shown in FIGS. 3 and 4; exhibits a much lower temporal drift of PCM device parameters $V_{th}$, and the amorphous state resistance R than the thin film PCM device 100. The typical reset resistance data can be approximated by the power dependence $R(t)=R(t_0)(t/t_0)^\alpha$, where $\alpha$ is in the range of 0.002 to 0.01 depending on the diameter of the nanowire 115. Preferably the resistance drift coefficient is less than 0.01, and more preferably less than 0.005.

Figure 5:
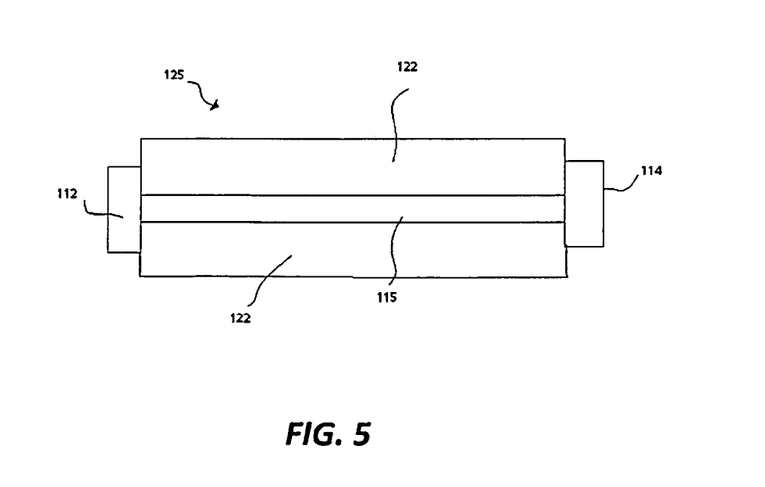
FIG. 5 is a cross-sectional view of a nanowire embedded under a thick layer of silicon oxide.

Nanowire PCM devices 100 exhibit a lower order of magnitude drift-coefficient than conventional thin-film PCM devices 10, such as those depicted in FIG. 2. To demonstrate the effect of stress on resistance drift, the same nanowire 115 was embedded under a thick (250 nm) silicon oxide film 122, as shown in FIG. 5, and the resistance drift upon amorphization was measured. The embedded nanowire device 125 shows a very high resistance drift coefficient, 0.08, in comparison to a resistance drift coefficient of 0.0011 for the free-standing nanowire PCM device 100. This experiment demonstrated that embedding the nanowire 115 diminishes the capacity of the device to release its stress upon amorphization.

Unlike thin film devices or embedded devices, small diameter (sub-100 nm) phase change devices such as nanowire 115 do not have a completely embedded amorphized dome-like structure. The lack of a completely embedded amorphized dome-like structure, enables the nanowire PCM device 100 to efficiently relax its stress very rapidly due to the large available surface area 120, leading to very different (and low) drift characteristics. The origin of stress in the nanowire 115 is predominantly due to considerable differences between the specific volumes of the crystalline phase and the disordered amorphous glassy state formed by the melt-quenching, which can vary by several percent. However, the nanowire 115 may relax very efficiently and almost instantaneously due to the large surface area 120 available. Therefore, nanowire PCM device 100 exhibits less drift in amorphous-state, resistance and threshold voltage than thin-film PCM devices 10 because of its device structure which is substantially free standing.

FIG. 6 is a graph showing the temporal drift of $V_{th}(t)$ and R(t) for a GST thin film PCM device 10. There is shown a large drift in parameters. The fitting curves show power-law and lognormal behaviors.

Figure 7:
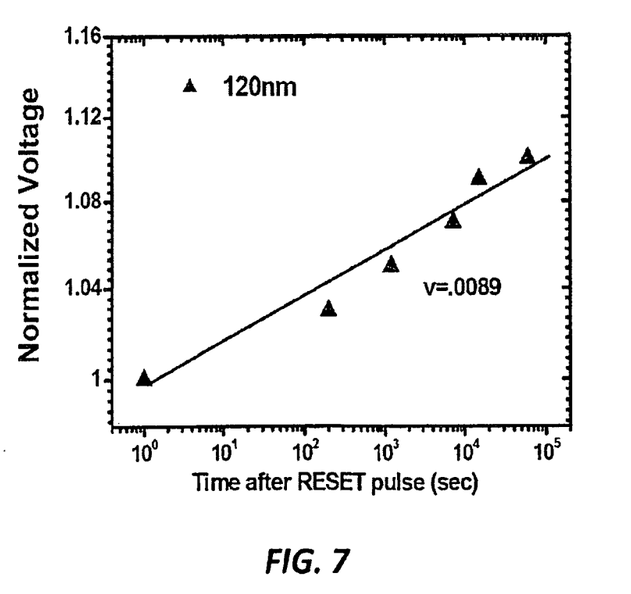
FIG. 7 is a graph showing the drift in threshold voltage for a 120 nm unembedded phase change memory device.

FIG. 7 is a graph showing the drift in threshold voltage for a 120 nm unembedded nanowire phase change memory device 100, such as that shown in FIGS. 3 and 4.

Figure 8:
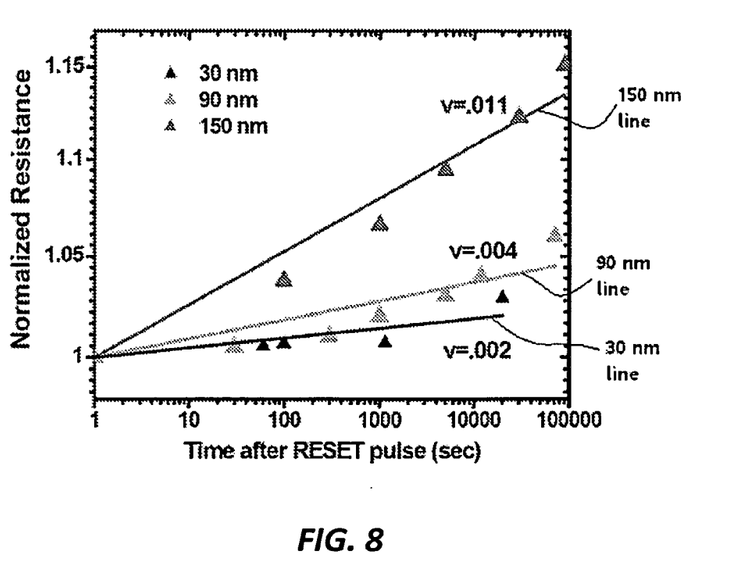
FIG. 8 is a graph showing resistance drifts of phase change nanowire devices as a function of nanowire diameter.

FIG. 8 is a graph showing the resistances drift of nanowire PCM devices 100 as a function of nanowire diameter. As shown in the graph, smaller size nanowires exhibit a lower drift and smaller size nanowires have a larger surface to volume ratio. The diameters of the nanowires 115 shown in FIG. 8 are 150 nm, 90 nm, and 30 nm. The nanowire 115 that has a 30 nm diameter has the lowest drift coefficient and the largest surface to volume ratio. Some examples of suitable surface-to-volume ratios for various diameter nanowires 115 may be: for a 30 nm diameter nanowire 115, an exemplary surface-to-volume ratio may be approximately, 0.1333 (1/nm); for a 50 nm diameter nanowire, an exemplary surface-to-volume ratio may be approximately 0.08 (1/nm); for a 100 nm diameter nanowire, an exemplary surface-to-volume ratio may be approximately 0.04 (1/nm) and for a 200 nm diameter nanowire, an exemplary surface-to-volume ratio may be approximately 0.02 (1/nm). Preferably the surface-to-volume ratio is greater than or equal to 0.01 (1/nm) and, more preferably, the surface-to-volume ratio is greater than or equal to 0.06 (1/nm).

Figure 9:
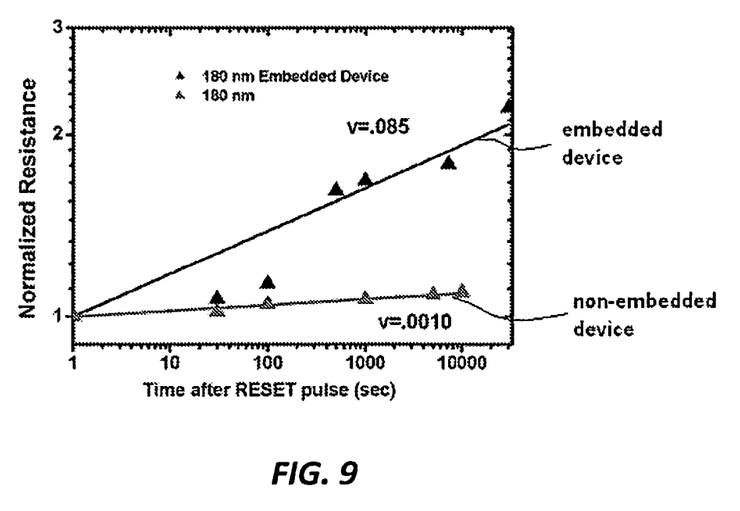
FIG. 9 is a graph showing a comparison of resistance drift behavior of a free standing nanowire device and the behavior of the same nanowire device embedded under a 250 nm silicon oxide film.

FIG. 9 is a graph comparing the resistance drift behavior of the free standing nanowire PCM device 100 with the same nanowire 115 embedded under a 250 nm silicon oxide film, as shown in FIG. 5. The embedded nanowire device 125 shows a much higher resistance drift coefficient than a free standing nanowire PCM device 100, which demonstrates that the availability of free surface area is important for achieving less resistance drift in such devices.

Figure 10:
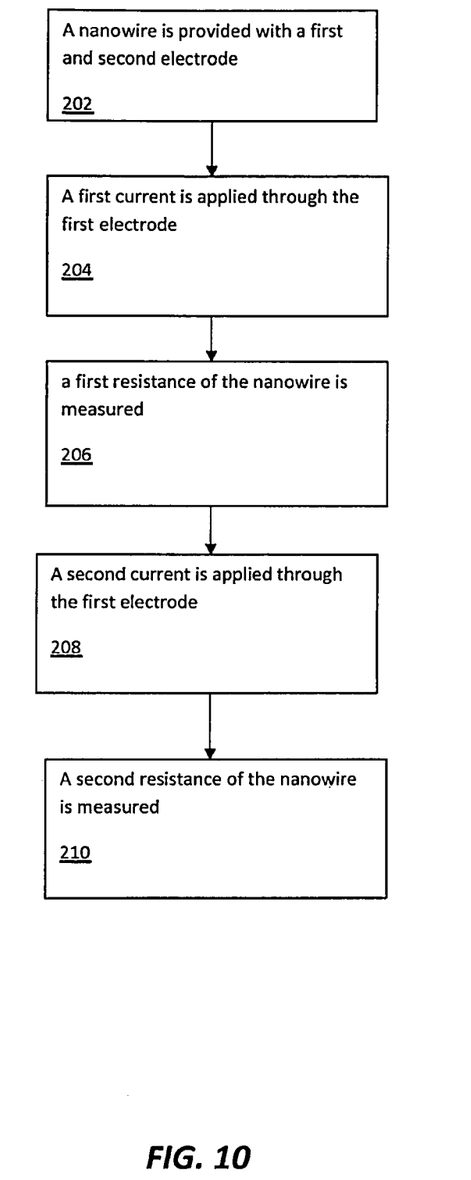
FIG. 10 is a flow chart showing a process in which the nanowire PCM device is used.

FIG. 10 is a flow chart showing a method of using the nanowire PCM device 100 wherein the different measured resistances are used to correspond to digital bits 1 and 0. In step 202, a nanowire 115 is provided with a first electrode 112 and a second electrode 114 connected thereto. In step 204, a first current is applied through the first electrode 112 and forming an amorphized region. In step 206, a first resistance of the nanowire 115 is measured using conventional electrode meters. In step 208, a second current is applied through the first electrode. The second current forms a crystalline lattice within the nanowire 115. In step 210, a second resistance of the nanowire 115 is measured using a probe. The drift coefficient of the nanowire 115 is less than 0.01 and is preferably less than 0.005. It should be understood that in order to read the memory and access the various physical aspects of the nanowire PCM device 100, the PCM device 100 may be connected to a processor (not shown) and circuitry familiar to those of ordinary skill in the art.

Figure 11:
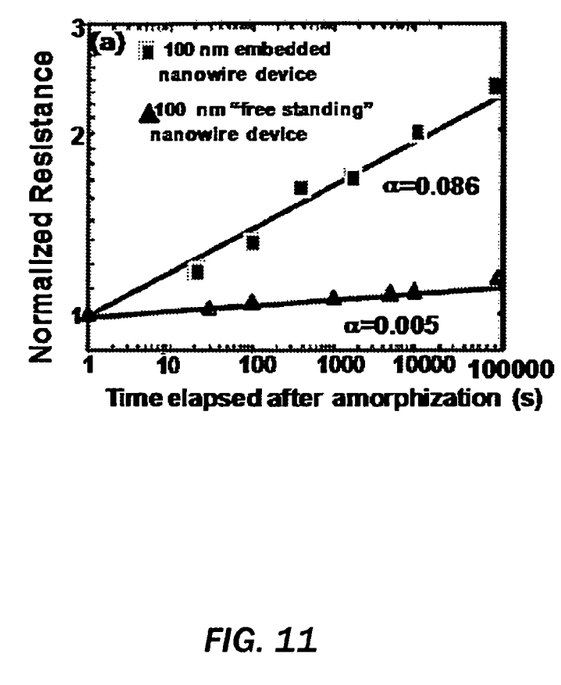
FIG. 11 is a graph showing a comparison of resistance drift behavior of a free standing nanowire device and the behavior of the same nanowire device embedded under a 300 nm silicon oxide film.

FIG. 11 is a graph showing a comparison of resistance drift behavior of a free standing nanowire PCM device 100 and the behavior of the same nanowire 115 embedded under a 300 nm silicon oxide film. In this example, phase change $Ge_2Sb_2Te_5$ nanowires 115 were synthesized using the bottom-up approach of catalyst mediated vapor-liquid-solid process. Nanowire PCM devices 100 were fabricated with Pt electrodes 112, 114 and their resistances were measured at 0.2V (d.c.). The nanowire PCM devices 100 were amorphized by 200 ns electrical pulses to resistance values of 1-4MΩ, and then allowed to relax over 5 decades of time during which the resistance was measured at different intervals. For $V_{th}$ drift measurements, d.c. I-V sweeps were measured beyond the $V_{th}$ and the nanowire PCM devices 100 were amorphized back to the original resistance for time-dependent measurements.

Figure 12:
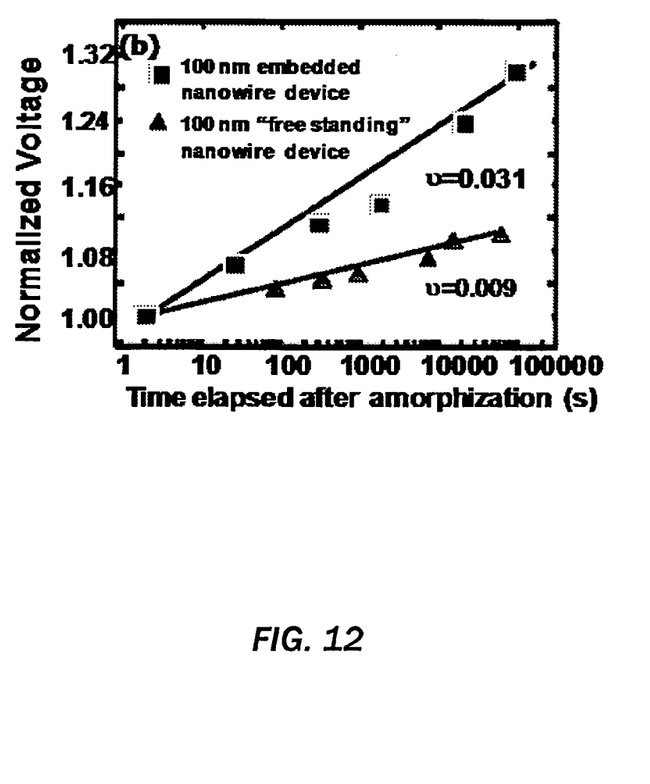
FIG. 12 is a graph showing the drift of normalized Vth for a free standing nanowire device and the behavior of an embedded nanowire device.

The time evolution of amorphous state resistance (normalized at t=1 s, first measurement) of a 100 nm thick nanowire PCM device 100 from the initial value of 2.1MΩ shown in FIG. 11, shows that the resistance drift is very small with the resistance increasing to just 2.3 MΩ over five decades in time. The data was fit to a power law:

$$R(t)=R(t_0)(t/t_0)^\alpha$$

with the power exponent, $\alpha$ of 0.005, which is very small in comparison to thin-film devices where $\alpha$ typically ranges from 0.03-0.1. The corresponding data, shown in FIG. 12, for drift in $V_{th}$ (normalized at 2 s, first measurement) can be fit to the equation:

$$\frac{\Delta V_{th}(t)}{V_{th}(t_0)} \equiv \frac{V_{th}(t) - V_{th}(t_0)}{V_{th}(t_0)} = \nu \ln\frac{t}{t_0},$$

which also reveals a lower drift exponent ($\nu$=0.009) in comparison to typical values ranging from 0.01-0.04 in thin-films. These experiments demonstrate that drift coefficients are lower in nanowire PCM devices 100 in comparison to thin-films.

Figure 13:
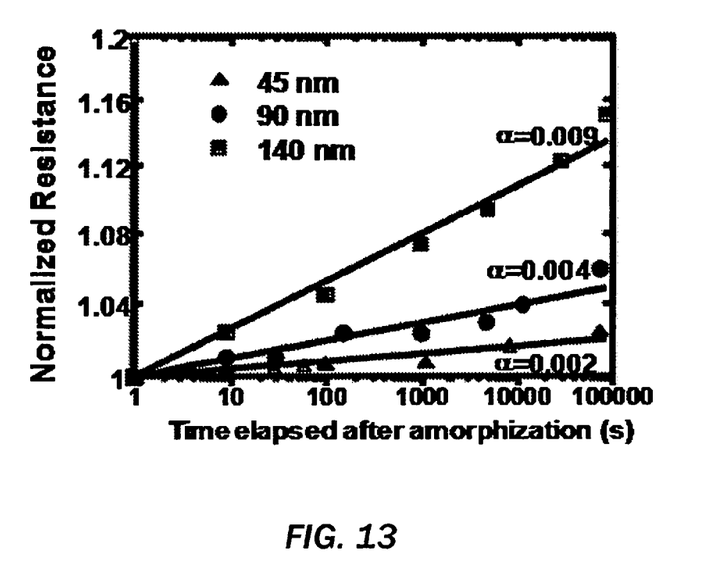
FIG. 13 showing a graph of size dependent drift of normalized resistance of nanowire devices.

FIG. 13 shows a graph of size dependent drift of normalized resistance of nanowire PCM devices 100. In order to study the correlation of drift coefficients with nanowire 115 size, we measured the resistance drift on three different nanowire 115 thicknesses, 140, 90 and 45 nm, all amorphized to resistance values that were ~100 times more than their crystalline state resistance. The nanowire PCM devices 100 show a systematic size-dependent drift of amorphous state resistance in FIG. 13; the drift coefficients increase with increasing thickness of the nanowires 115. The thinnest nanowire 115 (45 nm) with the highest surface-to-volume ratio shows the lowest drift ($\alpha$=0.002), while the thickest nanowire 115 (140 nm) with the lowest surface-to-volume ratio shows higher drift coefficient ($\alpha$=0.009), but much smaller than thin-film devices. The $V_{th}$ drift coefficients did not reveal any clear size-dependence, mostly because the $V_{th}$ changes typically from ~1.5 V (t=2 s) to ~1.7 V (t=$10^5$ s) for nanowire PCM devices 100, a small increase to reliably extract their size-dependence.

The above described data suggests that the unique geometry of nanowire PCM devices 100 with exposed surfaces may be responsible for the observed low but size-dependent drift coefficients. In order to explore the effect of exposed surfaces on drift in nanowires 115, measurements were performed on the same nanowire PCM devices 100 by depositing thick (~300 nm) dielectric films such as $SiO_2$ or $Si_3N_4$ on them. The nanowire PCM devices 100 were then imaged with SEM to ensure that they were completely embedded. The same 100 nm nanowire PCM device 100 as discussed in FIGS. 11 and 12, but embedded under $SiO_2$ film was amorphized again to a resistance value of 2.1MΩ and its resistance drift was measured. The nanowire PCM device 100 now showed a much higher resistance ($\alpha$=0.086, compared to 0.005 for un-embedded), and $V_{th}$ drift coefficients ($\nu$=0.031, compared to 0.009 for un-embedded), which are similar to values reported for embedded thin-film PCM devices. Similar values of increase of drift coefficients for nanowires 115 embedded under $Si_3N_4$ film in comparison to un-embedded devices were obtained. The data suggest that the drift characteristics of the devices can be engineered by altering their surface-to-volume ratio and exposing/embedding the surfaces.

Our measurements on nanowire PCM devices 100 demonstrate the difference in drift behavior as a function of surface-to-volume ratio and exposed surfaces. These observations suggest that the efficient relaxation of the built-in stress upon amorphization is primarily responsible for drift in PCM devices 100 in comparison to annealing of electronic defects or VAP generation mechanisms. In a conventional thin-film PCM device 10, a polycrystalline film is sandwiched between two electrodes; upon amorphization, a completely embedded amorphous dome results, which is compressed under large stresses from the surrounding materials. In the course of time, the metastable amorphous region relaxes with a large distribution of timescales, which has been mapped with stress relaxation experiments, resulting in a time-dependent increase of resistance and $V_{th}$ due to volume dilation. These relaxations have been extensively studied in glasses and have been attributed to atomic relaxations, where unsaturated and distorted bonds in the metastable state relax to more stable states leading to time-dependent mechanical and electrical properties.

Unlike thin-film devices, nanowire PCM devices 100 do not have a completely embedded amorphized dome, which will enable them to relax their stress rapidly from the large available surface, shown in FIGS. 14(a)-14(d), leading to very different drift behavior as observed. Typically, phase change nanowires 115 have a ~1-2 nm coaxial surface oxide shell which can easily expand when the nanowire PCM device 100 is locally amorphized thereby releasing the stress. Smaller diameter nanowires 115 have large surface-to-volume ratio and can relax their stress more easily. Nanowires 115 can be epitaxially grown on highly mismatched substrates and their heterostructures can be created to withstand large strains due to the free surfaces allowing for lateral strain relaxation. Theoretical studies on nanostructures have also revealed that strain-relaxation become more efficient with increasing surface-to-volume ratio. For nanowires 115 buried under dielectric-films, the situation becomes similar to conventional thin-film PCM devices 10 and the amorphous region cannot relax the built-in pressure and hence relaxes slowly on multiple timescales leading to higher drift. This is in agreement with crystallization-induced stress measurements in $Ge_2Sb_2Te_5$ thin-films where the stress was reported to be much higher for capped films. It is unlikely that the deposition of the dielectric-film significantly alters the electronic properties of the nanowires 115 as the presence of the thin coaxial oxide layer minimizes their direct interaction. In addition, the drift properties of the embedded nanowire devices 125 do not appear to be dependent on the dielectric composition, although the drift dependence on the film thickness and stiffness would require further investigation.

Figure 14:
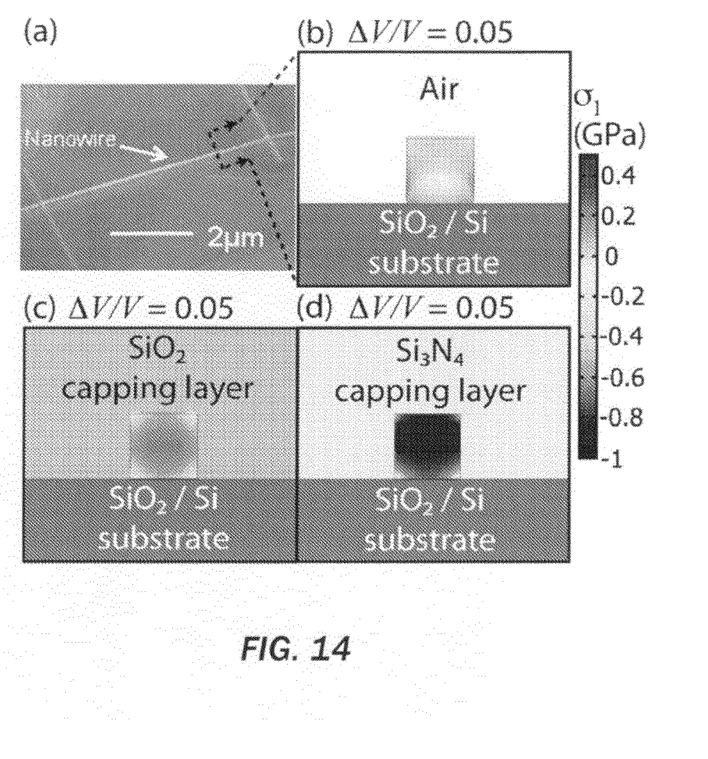
FIGS. 14(a)-(d) show an image of non-embedded nanowire device and images of embedded nanowire devices.

The elastic stresses associated with the amorphization of the nanowire geometry for both the embedded and un-embedded devices have been estimated using finite element analysis to provide insight on the relationship between drift and structural confinement. Plane strain 2D calculations were performed on a $Ge_2Sb_2Te_5$ NW cross-section (100 nm×100 nm) on a $SiO_2$ substrate, where the bottom surface of the nanowire was constrained while the other surfaces were modeled as free as shown in FIG. 14(b). The first principal stress $\sigma_1$ for the un-embedded nanowire 115, reveals that a very small but finite stress develops due to the constraint from the substrate. In contrast, large compressive stresses develop when Sio2 and SI3N4 capping layers are applied due to confinement effects upon amorphization, which are 20 times more than the un-embedded case. The low and size-dependent drift coefficients are consistent with the notion of the high surface-to-volume ratio of the nanowire 115 serving to effectively accommodate the stresses.

The information in the present application clearly demonstrates that a nanowire PCM device 100 has an intrinsic extremely low level of resistance and threshold voltage drift and that efficient relaxation of stress in the device by the provision of a surface area 120 may be used to provide low-drift memory devices. The large surface area 120 of nanowires 115 leads to a low level of drift in the device parameters. Additionally, the very thin dielectric layer that is present in free standing nanowires 115, as well as the possible flexibility of the nanowires 115, relieves the stress that builds in the system upon amorphization almost instantaneously, which also leads to extremely low drift in device parameters.

PCM Nanowire, or nanopillar type devices, which are not embedded under thick material layers, may also be useful for low-drift memory devices since they capture some of the features described in the nanowire PCM device 100. In addition, if thin-film devices need to be provided for low-drift, then device architectures need to ensure that the active region of the phase change film that amorphizes has sufficient free surface area to efficiently relax the in-built strain.

Ever since the discovery of drift in resistance and threshold voltage, it has been a hindrance to development of phase change materials for practical devices, especially for multi-level bit operation. There are two major ideas that have attempted to explain the drift behavior: 1) the stress that builds up in thin film devices, and 2) the electronic annealing and relaxation with time. The results of the present invention show that it is stress that leads to data drift and that the data drift can be significantly reduced by efficient relaxation of stress. The results suggest new ideas about how the device should be designed, for example using pillar geometry, nanowire geometry or thin-film geometry, while ensuring that the amorphized region can release its stress in order to minimize drift in phase change memory devices. This is an important contribution to the field from both an academic point of view and practical device design for commercial applications.

Phase-change random access memory (PRAM) is most promising in order to realize a multi-level cell (MLC) operation because it has a very wide range of resistance across two orders of magnitude or higher with respect to writing current. According to the PRAM road map, it is expected that highest memory densities of PRAM will be comparable to memory densities of conventional memories such as NOR Flash and DRAM in coming years when MLC operation is fully accomplished. Phase-change memory (PCM) is becoming widely recognized as the most likely candidate to unify the many memory technologies that exist today. The combination of non-volatile attributes of Flash, RAM-like bit-alterability, and fast reads and write position PCM to enable changes in the memory subsystems of cellular phones, PCs and countless embedded and consumer electronics applications. This design's multi-level cell (MLC) capabilities combined with long term scalability reduce PCM costs as only realized before by hard disk drives. MLC technology is challenged with fitting more cell states (4 in the case of 2 bit per cell), along with distribution spreads due to process, design, and environmental variations, within a limited window.

By adding two more bits per cell, phase-change memory can be on par with today's flash technology. Probably the biggest challenge for phase change memory is its long-term resistance and threshold voltage drift. The resistance of the amorphous state slowly increases according to a power law ($\sim t^{0.1}$). This severely limits the ability for multilevel operation (a lower intermediate state would be confused with a higher intermediate state at a later time) and could also jeopardize standard two-state operation if the threshold voltage increases beyond the design value. The present studies of phase change nanowire devices of the invention shows much lower temporal drift of PCM device parameters $V_{th}$, and the amorphous state resistance R when compared to the conventional PCM thin-film based memory. It has been observed that nanowire PCM devices 100 exhibit a lower order of drift coefficient and (almost an order less than conventional thin film PCM devices 10), because of device architecture and the provision of a large surface area which is free to expand/contract to relieve stress build up. Therefore, by using this new knowledge, future device designs based on nanowires, nanopillars, bridges or thin-film geometries may be employed so long as the region where amorphization takes place is free to expand/contract.

Over the past decade, flash memory has changed the electronics landscape, giving us robust storage in tiny devices such as iPods and cell phones. As chip sizes shrink, there will be limits to flash performance, and a replacement technology will be needed. Phase-change memory may provide this needed replacement. Phase-change memory differs from other solid-state memory technologies such as flash and random-access memory because it doesn't use electrons to store data. Instead, it relies on the material's own arrangement of atoms, known as its physical state. It has been demonstrated that PCM devices are much faster in switching, more durable, having a cycle endurance of $10^8$ cycles, have random have access capabilities and show promise for scalability and multi-level bit data storage.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A nanowire phase change memory device comprising: a nanowire free-standing between a first electrode located at a first end of the nanowire and a second electrode located at a second end of the nanowire, wherein a dielectric material surrounds the nanowire and the dielectric material has a thickness less than half the thickness of the nanowire.

2. The phase change memory device of claim 1, wherein the nanowire is comprised of a chalcogenide material.

3. The phase change memory device of claim 1, wherein the nanowire resistance drift coefficient is less than 0.01.

4. The phase change memory device of claim 3, wherein the nanowire resistance drift coefficient is less than 0.005.

5. The phase change memory device of claim 1, wherein the diameter of the nanowire is less than 90 nm.

6. The phase change memory device of claim 5, wherein the diameter of the nanowire is less than or equal to 30 nm.

7. The phase change memory device of claim 1, wherein a surface to volume ratio of the nanowire is greater than or equal to 0.01 (1/nm).

8. The phase change memory device of claim 1, wherein a dielectric material surrounds the nanowire and the dielectric material has a thickness less than 20 nm.

9. A phase change memory device comprising:
a chalcogenide compound free-standing between a first electrode operably connected to the chalcogenide compound and a second electrode operably connected to the chalcogenide compound, wherein the chalcogenide compound is adapted to form a free-standing and amorphized region and wherein the resistance drift coefficient is less than 0.01, wherein a dielectric material surrounds the nanowire and the dielectric material has a thickness less than half the thickness of the nanowire.

10. The phase change memory device of claim 9, wherein the resistance drift coefficient is less than 0.005.

11. The phase change memory device of claim 9, wherein the compound is formed into a nanowire.

12. The phase change memory device of claim 11, wherein a dielectric material surrounds the nanowire and the dielectric material has a thickness less than 20 nm.

13. The phase change memory device of claim 11, wherein the diameter of the nanowire is less than 90 nm.

14. The phase change memory device of claim 13, wherein the diameter of the nanowire is greater than or equal to 30 nm.

15. The phase change memory device of claim 9, wherein the compound is formed into a thin-film that is free standing.

16. The phase change memory device of claim 9, wherein a surface to volume ratio of the nanowire is greater than or equal to 0.01 (1/nm).

17. The phase change memory device of claim 1, wherein a dielectric material surrounds the nanowire and the dielectric material has a thickness less than one-third the thickness of the nanowire.

18. The phase change memory device of claim 9, wherein a dielectric material surrounds the nanowire and the dielectric material has a thickness less than one-third the thickness of the nanowire.

* * * * *